US009269923B2

United States Patent
Choi et al.

(10) Patent No.: US 9,269,923 B2
(45) Date of Patent: Feb. 23, 2016

(54) BARRIER FILMS FOR THIN FILM ENCAPSULATION

(71) Applicant: Applied Materials, Inc., Santa Clara, CA (US)

(72) Inventors: Young Jin Choi, San Jose, CA (US); Beom Soo Park, San Jose, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/203,419

(22) Filed: Mar. 10, 2014

(65) Prior Publication Data

US 2014/0264296 A1    Sep. 18, 2014

Related U.S. Application Data

(60) Provisional application No. 61/778,067, filed on Mar. 12, 2013.

(51) Int. Cl.
| | | |
|---|---|---|
| *H01L 33/00* | (2010.01) | |
| *H01L 51/52* | (2006.01) | |
| *H01L 33/52* | (2010.01) | |
| *H01L 33/44* | (2010.01) | |
| *H01L 33/56* | (2010.01) | |

(52) U.S. Cl.
CPC ........ *H01L 51/5253* (2013.01); *H01L 33/0075* (2013.01); *H01L 33/44* (2013.01); *H01L 33/52* (2013.01); *H01L 33/56* (2013.01)

(58) Field of Classification Search
CPC ......... H01L 33/32; H01L 33/44; H01L 33/52; H01L 33/0075; H01L 33/56
See application file for complete search history.

(56) References Cited

U.S. PATENT DOCUMENTS

| | | | |
|---|---|---|---|
| 2004/0213962 A1 | 10/2004 | Bourdelais et al. | |
| 2004/0245541 A1* | 12/2004 | Shitagaki et al. | 257/103 |
| 2005/0139750 A1* | 6/2005 | Dobashi et al. | 250/208.1 |
| 2006/0110580 A1 | 5/2006 | Aylward et al. | |
| 2010/0308353 A1 | 12/2010 | Grabowski et al. | |
| 2011/0049730 A1* | 3/2011 | Schmid et al. | 257/787 |
| 2012/0164829 A1* | 6/2012 | Rajagopalan et al. | 438/675 |
| 2012/0199872 A1* | 8/2012 | Chen et al. | 257/100 |
| 2012/0241811 A1* | 9/2012 | Kim et al. | 257/100 |

(Continued)

FOREIGN PATENT DOCUMENTS

| | | |
|---|---|---|
| KR | 10-2005-0046922 | 3/2006 |
| KR | 1020110000818 | 1/2011 |

OTHER PUBLICATIONS

Han-Ki Kim, Sang-Woo Kim, Do-Geun Kim, Jae-Wook Kang, Myung Soo Kim, and Woon Jo Cho, Thin Solid Films 515(2007)4758.

(Continued)

*Primary Examiner* — Ngan Ngo
(74) *Attorney, Agent, or Firm* — Patterson & Sheridan, LLP

(57) ABSTRACT

A method and apparatus for depositing an inorganic layer onto a substrate is described. The inorganic layer may be part of an encapsulating film utilized in various display applications. The encapsulating film includes one or more inorganic layers as barrier layers to improve water-barrier performance. An oxygen containing gas, such as nitrous oxide, is introduced during the deposition of the inorganic layer. As a result, the inorganic layer is lower in stress and may obtain a water vapor transmission rate (WVTR) of less than 100 mg/m²-day.

14 Claims, 3 Drawing Sheets

(56) References Cited

U.S. PATENT DOCUMENTS

2013/0153915 A1* 6/2013 Choi et al. ............... 257/72
2013/0295739 A1* 11/2013 Hsiao et al. ............... 438/285

OTHER PUBLICATIONS

Anna Maria Coclite and Karen K. Gleason, J. Appl. Phys. 111(2012)073516.
Jian-Shian Lin, Ming-Hua Chung, Chen-Ming Chen, Fuh-Shyang Juang, and Lung-Chang Liu, J. Phys. Org. Chem. 24(2011)193.
H.-J. You, Rev. Sci. Instrum. 84(2013)073513.
Kazufumi Azuma, Satoko Ueno, and Yoshiyuki, Thin Solid Films 580(2015)116.
FJH Van Assche, RT Vangheluwe, JWC Maes, WS Mischke, MD Bijker, and FC Dings, SID Dig 2004; 35:695-7.
H Lifka, HA van Esch, and JJWM Rosink, SID Dig 2004; 35:1384-7.
JJWM Rosink, H Lifka, GH Rietjens, and A Pierik, SID Dig 2005; 36:1272-5.
Renzheng Sang, Hao Zhang, Li Long, , Zikai Hua, Jianling Yu,, Bin Wei, , Xingyang Wu, Tao Feng, and, Jianhua zhang, International Conference on Electronic Packaging Technology & High Density Packaging, p. 1175 (2011).
E.N. Ermakova, S.V. Sysoev, L.D. Nikulina, I.P. Tsyrendorzhieva, V.I. Rakhlin, and M.L. Kosinova, Thermochimica Acta (2015) in press.
A Yoshida, S Fujimura, T Miyake, T Yoshizawa, H Ochi, and A Sugimoto, SID Dig 2003; 34:856-9.
H. Yasuda, "Plasma Polymerization", Academic Press Inc., Orlando (1985).
N. De Geyter, R. Morent, S. Van Vlierberghe, P. Dubruel, C. Leys, and E. Schacht, Surface Engineering vol. 27, No. 8 (2011)627.
Fulvia Villani, Paolo Vacca, Giuseppe Nenna, Olga Valentino, Gianbattista Burrasca, Tommaso Fasolino, Carla Minarini and Dario della Sala, J. Phys. Chem. C, 2009, 113 (30), pp. 13398-13402.
Marcel Hemerik, Rob Van Erven, Rik Vangheluwe, james Yang, Tom Van Rijswujk, Rogier Winters, and Bas Van Rens, SID Symp. Digest Vlo. 37, Issue 1 (2006)1571.
D. Hegemann, U. Vohrer, C. Oehr, and R. Riedel, Surface and Coating Technology 116-119(1999)1033-1036.
Mirjam Theelen, David Habets, Lutz Staemmler, Hans Winands, and Pieter Bolt, Surface and Coating Technology 211(2012)9-13.
Jrjyan Jerry Chen, "Thin Film Encapsulation by PECVD", Applied Materials.
Prashant Mandlik, Jonathan Gartside, Lin Han, I-Chun Cheng, Sigurd Wagner, Jeff A. Silvernail, Rui-Qing Ma, Michael Hack, and Julie J. Brown, Appl. Phys. Lett. 92(2008)103309.
Yun-Shivan Li, Chih-Hung Tsai, Shao-Hsuan Kao, I-Wen Wu, Jian-Zhang Chen, Chih-I Wu, Ching-Fuh Lin, and I-Chun Cheng, Physics D: Applied Physics vol. 46, No. 43, 435502(2013).
Tae Won Kim, Min Yan, Ahmet Gun Erlat, paul A. McConnelee, Mathew Pellow, John Deluca, Thomas P. Feist, Anil R. Duggal, and Marc Schaepkens, J. Vac. Sci. Technol. A 23(2005)971.
A. P. Ghosh, L. J. Gerenser, C. M. Jaman, and J. E. Fomalik, Appl. Phys. Lett. 86(2005)223503.
Seung-Woo Seo, Heeyeop Chae, Sang Joon Seo, Ho Kyoon Chung, and Sung Min Cho, Appl. Phys. Lett. 102(2013)161908.
P. F. Carcia, R. S. McLean, M. D. Groner, A. A. Dameron, and S. M. George, J. Appl. Phys. 106(2009)023533.
F. L. Wang, M. K. Fung, S. L. Tao, S. L. Lai, W. M. Tsang, K. H. Kong, W. M. Choy, C. S. Lee, and T. S. Lee, J. Appl. Phys. 104(2008)014509.

* cited by examiner

BARRIER FILMS FOR THIN FILM ENCAPSULATION

CROSS-REFERENCE TO RELATED APPLICATIONS

This application claims benefit of U.S. provisional patent application Ser. No. 61/778,067 (APPM20417USL), filed Mar. 12, 2013, which is herein incorporated by reference.

BACKGROUND OF THE INVENTION

1. Field of the Invention

Embodiments disclosed herein generally relate to the deposition of thin films using chemical vapor deposition (CVD) processing. More particularly, embodiments generally relate to methods for depositing barrier layers onto large area substrates.

2. Description of the Related Art

Organic light emitting diodes (OLED) are used in the manufacture of television screens, computer monitors, mobile phones, other hand-held devices, or other devices for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

The encapsulation is achieved by sealing the active materials in inert atmosphere using a glass lid secured by a bead of UV-cured epoxy resin. The rigid encapsulation is not applicable to flexible displays, where a durable and flexible encapsulation is necessary to protect the active OLED materials from water moisture and oxygen. One approach is to use a multilayer encapsulating structure as a barrier to water moisture and oxygen permeation. Inorganic layers can be incorporated into the multilayer encapsulating structure as the main barrier layer. Organic layers can also be incorporated for the purposes of stress relaxation and water/oxygen diffusion channels decoupling layer.

Silicon nitride (SiN) is known as a good barrier material, thus it shows potential as an inorganic barrier layer in the multilayer encapsulation structure. However, SiN films deposited at low temperatures such as below 100 degrees Celsius have high stress, which can induce film peeling, also known as delamination, or mismatch issues in multi-film stack configurations. Due to the sensitivity of some of the layers of the OLED device, subsequently deposited layers over OLED materials will need to be deposited at lower temperatures, such as at temperatures less than 100° C.

Thus, there is a need for methods of depositing encapsulation/barrier films onto large area substrates with improved water-barrier performance to protect the devices underneath.

SUMMARY OF THE INVENTION

A method and apparatus for depositing an inorganic layer onto a substrate is described. The inorganic layer may be part of a multilayer encapsulating structure utilized in various display applications. The multilayer encapsulating structure includes one or more inorganic layers as barrier layers to improve water-barrier performance. One or more of the inorganic layers are composed of oxygen-doped silicon nitride. Oxygen-doped silicon nitride provides a low water vapor transmission rate while maintaining a low stress to prevent peeling or mismatch in the multilayer encapsulation structure.

In one embodiment, an OLED device can include an OLED structure formed on a substrate and a multilayer encapsulation layer formed over the OLED structure. The multilayer encapsulation structure can include one or more inorganic layers formed over the exposed surface of the OLED structure and the substrate, wherein at least one of the one or more inorganic layers comprises silicon nitride which is doped with nitrous oxide ($N_2O$).

In another embodiment, an OLED device can include an OLED structure formed on a substrate and a multilayer encapsulation layer formed over the OLED structure. The multilayer encapsulation structure can include a first inorganic layer formed on the exposed surface of the OLED structure and the substrate, one or more organic layers formed on the first inorganic layer and one or more second inorganic layer formed on at least one of the one or more organic layers, wherein at least one of the one or more second inorganic layers comprises silicon nitride which is doped with an oxygen-containing gas.

In another embodiment, a method of depositing an encapsulation structure can include positioning a substrate in a processing chamber, forming an OLED structure on the surface of the substrate, flowing a deposition gas comprising nitrous oxide and a silane compound into the processing chamber, wherein the nitrous oxide and the silane compound are delivered at a ratio of from about 0.3:1 to about 3:1 and depositing an inorganic layer from the deposition gas over the surface of the OLED structure and the substrate, the inorganic layer comprising oxygen-doped silicon nitride.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

An OLED structure comprising an oxygen-doped silicon nitride barrier layer and methods for making the same are described. The inorganic layer may be part of a multi-layer film stack utilized in various display applications. The multi-layer film stack includes one or more inorganic layers and one or more organic layers as barrier layers to improve water-barrier performance. One or more of the inorganic layers can be composed of oxygen-doped SiN. The oxygen-doped SiN maintains a high density while exhibiting a reduced stress as compared to standard SiN. The embodiments disclosed herein are more clearly described with reference to the figures below.

The invention is illustratively described below utilized in a processing system, such as a plasma enhanced chemical vapor deposition (PECVD) system available from AKT America, a division of Applied Materials, Inc., located in Santa Clara, Calif. However, it should be understood that the invention has utility in other system configurations, including those sold by other manufacturers.

Figure 1:
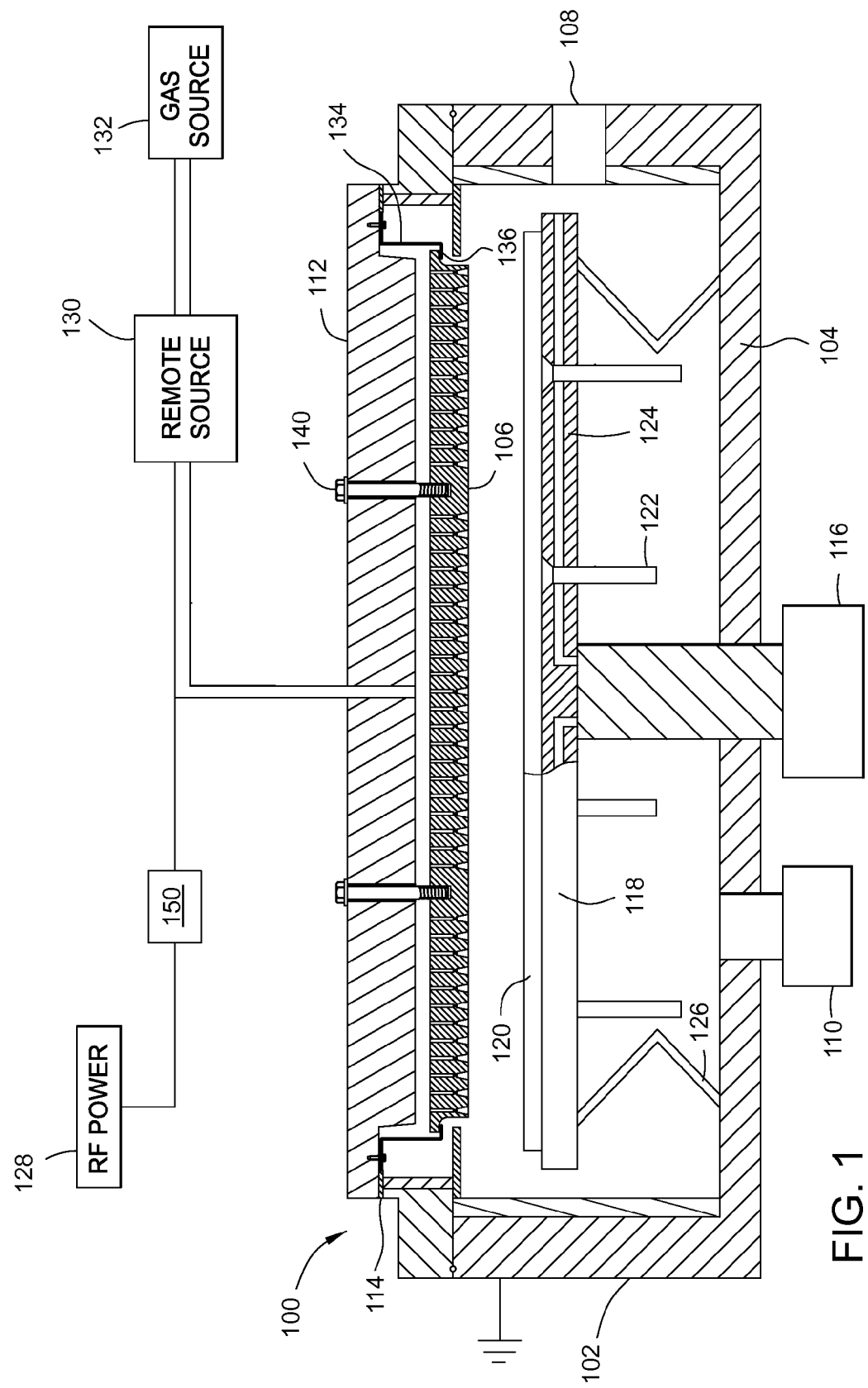
FIG. 1 is a process chamber useable with one or more embodiments.

FIG. 1 is a schematic, cross sectional view of a process chamber that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
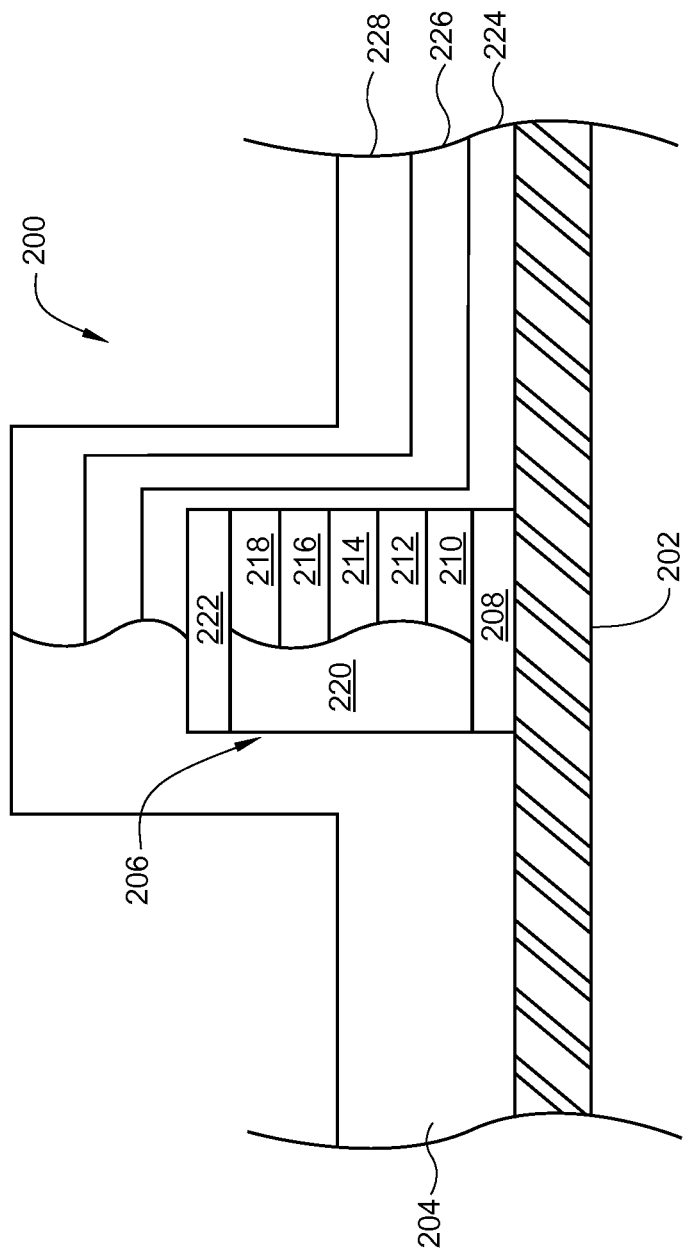
FIG. 2 is a cross-sectional schematic view of an OLED device with a multilayer encapsulating structure deposited on top according to one embodiment.

FIG. 2 depicts an OLED device 200 with a multilayer encapsulating structure 204 deposited on top according to one embodiment. The multilayer encapsulating structure 204 can be deposited on the substrate 202 using methods described herein. In one embodiment, the anode layer 208 is deposited on the substrate 202, which could be made of glass or plastic, such as polyethylene terephthalate (PET) or polyethylene naphthalate (PEN). An example of the anode layer 208 useable with one or more embodiments is an indium-tin-oxide (ITO). In one embodiment, the anode layer 208 can have a thickness of from about 200 Angstroms to about 2000 Angstroms.

After the anode layer 208, such as an indium tin oxide (ITO) layer, is deposited on the substrate 202, an organic stack 220 is deposited on the anode layer 208. The organic stack 220 can include a hole-injection layer 210, a hole-transport layer 212, an emissive layer 214, an electron-transport layer 216 and an electron injection layer 218. It should be noted that not all five layers are needed to build the organic stack 220 of the OLED device 206. In one embodiment, only a hole-transport layer 212 and an emissive layer 214 are used to form the organic stack 220. After deposition, the organic stack 220 is patterned.

After patterning surface of the organic stack 220, the cathode layer 222 is then deposited and patterned. The cathode layer 222 can be a metal, a mixture of metals or an alloy of metals. An example of the cathode material is an alloy of magnesium (Mg), silver (Ag), and aluminum (Al) in the thickness range of about 1000 Angstroms to about 3000 Angstroms.

The multilayer encapsulating structure 204 is deposited on top of the substrate surface after construction of the OLED device 206 is complete. In one embodiment, the multilayer encapsulating structure 204 includes a thin layer of inorganic nitride film, inorganic oxide film, and polymer-type organic film deposited in the thickness range of about 500 Angstroms to about 50,000 Angstroms, such as between about 2000 Angstroms to about 50,000 Angstroms. In one embodiment, silicon nitride (SiN), silicon oxynitride (SiON), silicon oxide (SiO), and silicon carbide (SiC), among others, can be used as the encapsulating material.

One embodiment of the invention provides that the multilayer encapsulating structure 204 deposited on a substrate 201 includes one or more layers of barrier/encapsulating materials, such as inorganic nitride, inorganic oxide film and polymer-type organic material. One or more additional material layers, such as various carbon-containing materials and polymer-type organic materials, and low-dielectric constant materials, e.g., amorphous carbon, diamond-like carbon, carbon-doped silicon containing material, etc., are deposited in the multilayer encapsulating structure 204 to enhance adhesion and soften the multilayer encapsulating structure 204.

The multilayer encapsulating structure 204 can include one or more organic layers and one or more inorganic layers. As stated above, the inorganic layers generally provide the barrier properties while the organic layers generally increase the flexibility of the multilayer encapsulating structure 204. In one embodiment, the multilayer encapsulating structure 204 includes a first inorganic layer 224, a second inorganic layer 228, and an organic layer 226 sandwiched between the first inorganic layers 224 and the second inorganic layer 228. Stated another way, the organic layers may be deposited as one or more layers in between or in contact with any one of the one or more inorganic layers. Further embodiments can use only the one or more inorganic layers.

In one embodiment, the multilayer encapsulating structure 204 having a thickness of about 1,000 Angstroms is then deposited over the surface of the substrate 202 and the OLED device 206. The multilayer encapsulating structure 204 can prevent water moisture and oxygen from penetrating into the OLED device 206 and/or the substrate 202. The multilayer encapsulating structure 204 may be deposited within a common chamber such that both the first inorganic layer 224, the second inorganic layer 228 and the organic layer 226 are deposited within the same chamber without breaking vacuum.

The one or more inorganic layers may comprise silicon, such as layers composed of SiN, SiON, oxygen-doped SiN, or other compositions containing silicon. Oxygen-doped SiN can include SiN doped with any dopant which comprises oxygen, such as $O_2$ or $N_2O$. At least one of the one or more inorganic layers should be composed of oxygen-doped SiN. The oxygen-doped SiN can have a stress of less than $-1.0*10^9$ dynes/cm$^2$.

Without intending to be bound by theory, it is believed that a stress of less than $-1.0*10^9$ dynes/cm$^2$ is desirable to prevent peeling of the layer. High stress in a layer can cause separation of the layer from underlying layers. This effect is exacerbated in multi-layer structures as stress in subsequent layers can compound on stress in previous layers. The stress in both the single layer and in the structure as a whole can cause peeling of the film, which, in the case of an encapsulation structure, can allow moisture and atmospheric conditions to reach sensitive components thus causing device failure. By depositing an oxygen-doped SiN layer, a low water vapor transmission rate can be maintained while using a low stress layer.

Figure 3:
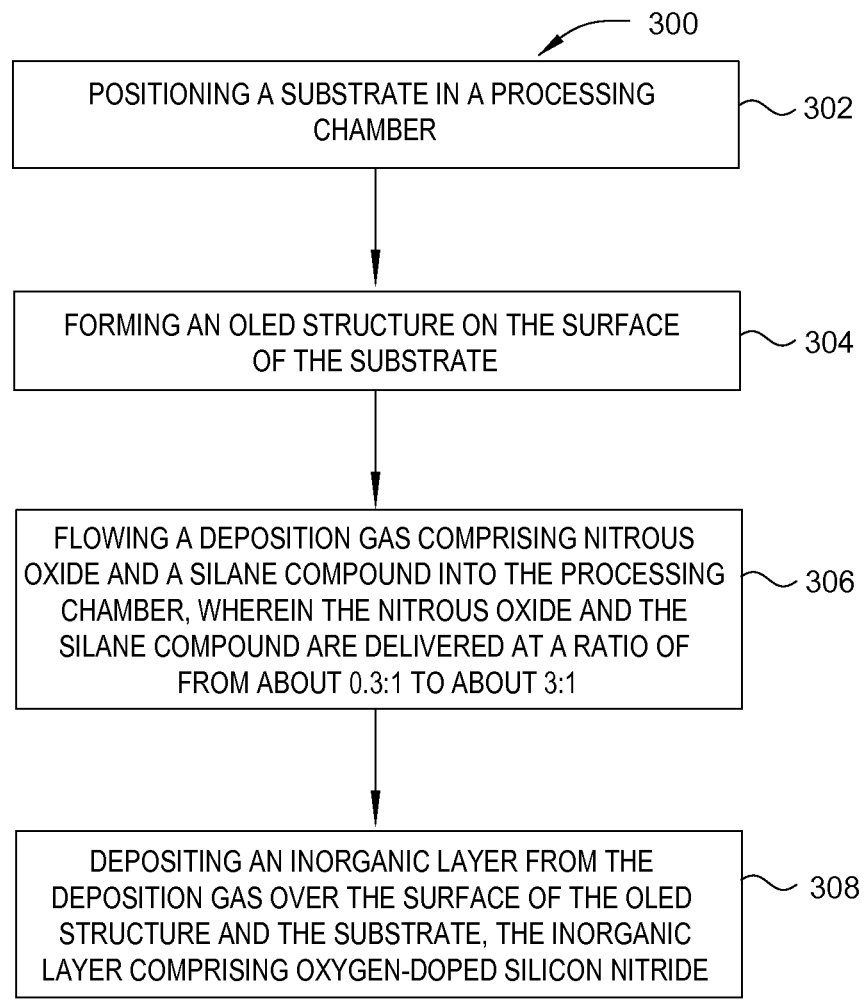
FIG. 3 is a flow diagram depicting a process of forming a multilayer encapsulating structure on a substrate according to one embodiment.

FIG. 3 is a flow diagram depicting a process 300 of forming a multilayer encapsulating structure on a substrate according to one embodiment. The process 300 begins with a substrate being positioned in a processing chamber, as in step 302. At this step, the substrate is positioned on the substrate support assembly and moved into the processing region. The substrate can be a standard substrate used in deposition of thin films, such as a thin sheet of metal, organic material, silicon, glass, quartz, polymer materials or plastic, such as polyethylene terephthalate (PET) or polyethylene naphthalate (PEN). Further, any suitable substrate size may be processed. Examples of suitable substrate sizes include substrate having a surface area of about 2000 centimeter square or more, such as about 4000 centimeter square or more, for example about 10000 centimeter square or more. In one embodiment, a substrate having a surface area of about 90000 centimeter square or more may be processed. The embodiments described below are in relation to a 5500 centimeter square substrate.

An OLED structure is then formed on the surface of the positioned substrate, as in step 304. The OLED structure comprises at least the hole-transport layer and the emissive layer along with the anode layer and the cathode layer, as described with reference to FIG. 2. However, the OLED structure can comprise all five layers as well as the anode and cathode layers described above or functional equivalents thereof.

After formation of the OLED structures, a deposition gas comprising an oxygen containing gas, such as $N_2O$, and a silane compound, such as $SiH_4$, is flowed into the processing chamber, as in step 306. The oxygen containing gas and the silane compound are delivered at a ratio of from about 0.3:1 to about 3:1. Oxygen containing gases can include $N_2O$, nitric oxide (NO), dinitrogen pentoxide ($N_2O_5$), dinitrogen tetroxide ($N_2O_4$), $O_2$, $O_3$, or combinations thereof. Silane containing gases can include SiH4, disilane, derivatives thereof and combinations thereof. The deposition gas can further include $H_2$, $N_2$, $NH_3$, inert gases or combinations thereof. To maintain a low temperature, the deposition gas is activated using a plasma source.

Using the deposition gas, an inorganic layer is deposited over the surface of the OLED structure and the substrate, as in step 308. The inorganic layer comprising oxygen-doped SiN. In one embodiment, the oxygen-doped SiN includes SiN which is doped by an oxygen containing compound, such as N2O, by the methods described above. The deposited oxygen-doped SiN layer can be between 20 Å and 1000 Å thick. Further, more than one oxygen-doped SiN layer may be used in forming the encapsulation structure. The oxygen-doped SiN layer may be used in conjunction with organic or inorganic films which are known in the art, such as SiO. The oxygen-doped SiN layer may be deposited as any layer of the encapsulation structure and may be sandwiched between other deposited layers of the encapsulation structure. For example, the oxygen-doped SiN layer may be deposited between an organic and an inorganic layer, an organic and an organic layer, or an inorganic and an inorganic layer. Inorganic layers can include the oxygen-doped SiN layers.

Without intending to be bound by theory, it is believed that doping using an oxygen-containing compound can reduce the stress intrinsic to silicon nitride layers deposited at low temperatures. OLED structures are sensitive to temperatures above 100 degrees Celsius. Since the encapsulation structure is deposited after the OLED structure is formed, the encapsulation structure can be deposited at temperatures which do not affect the function of the underlying OLED. In one embodiment, the encapsulation structure is deposited at temperatures below 90 degrees Celsius, such as temperatures of 85 degrees Celsius or less. By depositing a silicon nitride layer using a ratio of from about 0.3:1 to about 3:1 of oxygen containing compound to silane compound, the SiN is doped with the oxygen containing compound. This deposition process can be performed at temperatures below 100 degrees Celsius with good uniformity, reduced stress as compared to standard SiN layers and low water vapor permeability (having a WVTR of less than 100 mg/m$^2$-day, such as less than 75 mg/m$^2$-day).

Table 1 below shows examples from experimental data using one or more of the embodiments disclosed previously. The depositions were performed in an AKT-5500 PX PECVD chamber available from Applied Materials, Inc. located in Santa Clara, Calif. and standardized to sccm/m$^2$ of substrate processed. It is to be understood that embodiments described herein can be scaled up or down to compensate for different sized substrates and different sized chambers. As shown in each of the examples described below, the deposition parameters, such as flow rates, temperatures and pressures were maintained the same, with the exception of $N_2O$ flow rate.

TABLE 1

|    | SiH4 sccm/m$^2$ | NH3 sccm/m$^2$ | N2 sccm/m$^2$ | H2 sccm/m$^2$ | N2O sccm/m$^2$ | RF W | Pr mTorr | Sp mil | T C | Dep Time sec | N$_2$O/ SiH$_4$ ratio | WVTR (mg/m$^2$-day) | RI | D/R A/min | Stress E9 |
|----|-----|-----|-----|-----|-----|------|------|-----|----|-----|------|----|-------|------|-------|
| 01 | 0.175 | 0.396 | 0.996 | 1.660 | 0     | 4000 | 1600 | 900 | 85 | 300 | 0.00 | 40 | 1.863 | 2862 | −3.05 |
| 02 | 0.175 | 0.396 | 0.996 | 1.660 | 0.090 | 4000 | 1600 | 900 | 85 | 300 | 0.52 | 35 | 1.795 | 3204 | −1.68 |
| 03 | 0.175 | 0.396 | 0.996 | 1.660 | 0.182 | 4000 | 1600 | 900 | 85 | 300 | 1.04 | 75 | 1.744 | 3312 | −1.07 |
| 04 | 0.175 | 0.396 | 0.996 | 1.660 | 0.364 | 4000 | 1600 | 900 | 85 | 300 | 2.08 | 81 | 1.678 | 3718 | −0.44 |
| 05 | 0.175 | 0.396 | 0.996 | 1.660 | 0.545 | 4000 | 1600 | 900 | 85 | 300 | 3.13 | 95 | 1.634 | 3979 | −0.12 |

The first example depicts the deposition parameters for the SiN layer without N$_2$O doping. In this example, SiH$_4$, NH$_3$, N$_2$ and H$_2$ are delivered at 960, 2180, 5480 and 9128 sccm respectively. The SiN layer is deposited at 85 degrees Celsius in the presence of an RF plasma at 4000 W and at a pressure of 1600 mTorr. The deposited SiN layer without N$_2$O has a water vapor transmission rate (WVTR) of 40 mg/m$^2$-day, a refractive index of 1.863 and a relatively high compressive stress of −3.09*10$^9$ dynes/cm$^2$.

The second example depicts the deposition parameters for the SiN layer with 500 sccm N$_2$O. In this example, SiH$_4$, NH$_3$, N$_2$ and H$_2$ are delivered at 960, 2180, 5480 and 9128 sccm respectively (a N$_2$O:SiH$_4$ ratio of 0.52:1). The SiN layer is deposited at 85 degrees Celsius in the presence of an RF plasma at 4000 W and at a pressure of 1600 mTorr. The deposited oxygen-doped SiN layer has a water vapor transmission rate (WVTR) of 35 mg/m$^2$-day, a refractive index of 1.795 and a lower compressive stress of −1.68*10$^9$ dynes/cm$^2$.

The third example depicts the deposition parameters for the SiN layer with 1000 sccm N$_2$O. In this example, SiH$_4$, NH$_3$, N$_2$ and H$_2$ are delivered at 960, 2180, 5480 and 9128 sccm respectively (a N$_2$O:SiH$_4$ ratio of 1.04:1). The layer is deposited at 85 degrees Celsius in the presence of an RF plasma at 4000 W and at a pressure of 1600 mTorr. The deposited oxygen-doped SiN layer has a water vapor transmission rate (WVTR) of 75 mg/m$^2$-day, a refractive index of 1.744 and a compressive stress of −1.07*10$^9$ dynes/cm$^2$.

The fourth example depicts the deposition parameters for the SiN layer with 2000 sccm N$_2$O. In this example, SiH$_4$, NH$_3$, N$_2$ and H$_2$ are delivered at 960, 2180, 5480 and 9128 sccm respectively (a N$_2$O:SiH$_4$ ratio of 2.08:1). The SiN layer is deposited at 85 degrees Celsius in the presence of an RF plasma at 4000 W and at a pressure of 1600 mTorr. The deposited oxygen-doped SiN layer has a water vapor transmission rate (WVTR) of 81 mg/m$^2$-day, a refractive index of 1.678 and a compressive stress of −0.44*10$^9$ dynes/cm$^2$.

The fifth example depicts the deposition parameters for the SiN layer with 3000 sccm N$_2$O. In this example, SiH$_4$, NH$_3$, N$_2$ and H$_2$ are delivered at 960, 2180, 5480 and 9128 sccm respectively (a N$_2$O:SiH$_4$ ratio of 2.08:1). The SiN layer is deposited at 85 degrees Celsius in the presence of an RF plasma at 4000 W and at a pressure of 1600 mTorr. The deposited oxygen-doped SiN layer has a water vapor transmission rate (WVTR) of 81 mg/m$^2$-day, a refractive index of 1.634 and a compressive stress of −0.44*10$^9$ dynes/cm$^2$.

In the exemplary deposited SiN layers, the stress decreases as the N$_2$O concentration increases as compared to the SiH$_4$ concentration. However, the WVTR also increases as the N$_2$O concentration increases as compared to the SiH$_4$ concentration. Therefore, the WVTR and the stress are optimal at N$_2$O:SiH$_4$ ratios between 0.3:1 and 3:1, e.g. ratios from 0.5:1 to 3:1.

CONCLUSION

In summary, an inorganic layer, such as SiN layer, is deposited as a barrier layer for an OLED device. SiN can be deposited with a very low water vapor transmission rate but deposition at low temperatures creates a SiN layer which is high in compressive stress. In embodiments described herein, an oxygen containing gas is introduced during the deposition of the SiN layer to reduce the stress of the layer while maintaining a superior water vapor transmission rate.

While the foregoing is directed to embodiments of the present invention, other and further embodiments of the invention may be devised without departing from the basic scope thereof, and the scope thereof is determined by the claims that follow.

The invention claimed is:

1. An OLED device, comprising:
an OLED structure formed on a substrate; and
a multilayer encapsulation layer formed over the OLED structure comprising one or more inorganic layers formed over the exposed surface of the OLED structure and the substrate, wherein at least one of the one or more inorganic layers comprises oxygen-doped silicon nitride.

2. The OLED device of claim 1, wherein the water vapor transmission rate of the inorganic layer is less than 100 mg/m$^2$-day.

3. The OLED device of claim 1, wherein the OLED structure comprises a hole-injection layer, a hole-transport layer, an emissive layer, an electron-transport layer and an electron injection layer.

4. The OLED device of claim 1, wherein the one or more inorganic layers comprises silicon nitride and has a stress between −2*10$^9$ dynes/cm$^2$ and −0.1*10$^9$ dynes/cm$^2$.

5. The OLED device of claim 1, wherein the one or more inorganic layers further comprise silicon oxynitride (SiON), silicon oxide (SiO), silicon carbide (SiC) or combinations thereof.

6. An OLED device, comprising:
an OLED structure formed on a substrate; and
a multilayer encapsulation layer formed over the OLED structure comprising:
a first inorganic layer formed on the exposed surface of the OLED structure and the substrate;
one or more organic layers formed on the first inorganic layer; and
one or more second inorganic layer formed on at least one of the one or more organic layers, wherein at least one of the one or more second inorganic layers comprises silicon nitride which is doped with an oxygen-containing gas.

7. The OLED device of claim 6, wherein the oxygen-containing gas is nitrous oxide.

8. The OLED device of claim 6, wherein the oxygen-containing gas is nitric oxide or ozone.

9. The OLED device of claim 6, wherein the water vapor transmission rate of the inorganic layer is less than 100 mg/m$^2$-day.

10. The OLED device of claim 6, wherein the OLED structure comprises a hole-injection layer, a hole-transport layer, an emissive layer, an electron-transport layer and an electron injection layer.

11. The OLED device of claim 6, wherein at least one of the one or more second inorganic layers comprises silicon nitride and has a stress between $-2*10^9$ dynes/cm$^2$ and $-0.1*10^9$ dynes/cm$^2$.

12. The OLED device of claim 6, wherein the one or more second inorganic layers further comprise silicon oxynitride (SiON), silicon oxide (SiO), silicon carbide (SiC) or combinations thereof.

13. The OLED device of claim 6, wherein the first inorganic layer is an inorganic nitride or an inorganic oxide layer.

14. The OLED device of claim 6, wherein the one or more second inorganic layers are an inorganic nitride or an inorganic oxide layer.

* * * * *